United States Patent
Matsubara et al.

(10) Patent No.: US 9,473,334 B2
(45) Date of Patent: Oct. 18, 2016

(54) WIRELESS TRANSMISSION DEVICE

(71) Applicant: FUJITSU LIMITED, Kawasaki-shi, Kanagawa (JP)

(72) Inventors: Satoshi Matsubara, Kawasaki (JP); Mitsuharu Hamano, Sendai (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/628,936

(22) Filed: Feb. 23, 2015

(65) Prior Publication Data

US 2015/0280947 A1    Oct. 1, 2015

(30) Foreign Application Priority Data

Mar. 28, 2014 (JP) .................. 2014-070340

(51) Int. Cl.
| | |
|---|---|
| H04K 1/02 | (2006.01) |
| H04L 25/08 | (2006.01) |
| H04L 1/00 | (2006.01) |
| H03F 1/32 | (2006.01) |
| H03F 3/24 | (2006.01) |
| H03F 3/19 | (2006.01) |

(52) U.S. Cl.
CPC ............. *H04L 25/08* (2013.01); *H03F 1/3247* (2013.01); *H03F 3/19* (2013.01); *H03F 3/245* (2013.01); *H04L 1/0043* (2013.01); *H03F 2200/204* (2013.01); *H03F 2200/207* (2013.01); *H03F 2200/451* (2013.01); *H03F 2201/3233* (2013.01)

(58) Field of Classification Search
CPC ...... H03F 1/3247; H03F 3/24; H03F 1/3241; H04L 27/368; H04L 1/0003; H04L 1/0071; H04L 5/0007; H04L 1/0009; H04L 27/0008; H03G 3/3042

USPC ................. 375/297, 295, 316, 219
See application file for complete search history.

(56) References Cited

U.S. PATENT DOCUMENTS

| | | | |
|---|---|---|---|
| 7,433,421 B2 | 10/2008 | Shako et al. | |
| 7,856,069 B2 | 12/2010 | Nagatani et al. | |
| 8,461,925 B2 | 6/2013 | Matsubara et al. | |
| 2009/0146736 A1* | 6/2009 | Kim ............... | H03F 1/3247 330/149 |
| 2012/0025909 A1* | 2/2012 | Jo ................. | H03F 1/26 330/149 |

FOREIGN PATENT DOCUMENTS

| | | |
|---|---|---|
| JP | 2000-228643 A | 8/2000 |
| JP | 2006-74539 A | 3/2006 |
| JP | 2006-229889 A | 8/2006 |
| JP | 2011-199428 A | 10/2011 |
| WO | 2007036990 A1 | 4/2007 |

* cited by examiner

*Primary Examiner* — Zewdu Kassa
(74) *Attorney, Agent, or Firm* — Fujitsu Patent Center (57) ABSTRACT

A wireless transmission device includes an amplifier that amplifies power of a wireless transmission signal, a table that stores a plurality of distortion compensation coefficients used for compensating non-linear distortion of the amplifier, and a control unit that alternately performs reading of one distortion compensation coefficient and writing of one distortion compensation coefficient adjusted based on a feedback signal from the amplifier, by using any one port of the table at the time of update of any distortion compensation coefficient out of the plurality of distortion compensation coefficients stored in the table.

1 Claim, 7 Drawing Sheets

WIRELESS TRANSMISSION DEVICE

CROSS-REFERENCE TO RELATED APPLICATION

This application is based upon and claims the benefit of priority of the prior Japanese Patent Application No. 2014-070340, filed on Mar. 28, 2014, the entire contents of which are incorporated herein by reference.

FIELD

The embodiments discussed herein are related to a wireless transmission device.

BACKGROUND

The wireless transmission device in a wireless communication system is provided with an amplifier which amplifies power of a transmission signal. In general, the wireless transmission device allows the amplifier to operate in the vicinity of a saturation region of the amplifier for improving power efficiency of the amplifier. However, when the amplifier is allowed to operate in the vicinity of the saturation region, non-linear distortion increases. Therefore, in order to inhibit the non-linear distortion and reduce an ACLR (adjacent channel leakage ratio) the wireless transmission device is provided with a distortion compensation device which compensates the non-linear distortion.

One of distortion compensation systems used in the distortion compensation device is a "pre-distortion (hereinafter, sometimes also referred to as PD) system". A PD distortion compensation device multiplies a distortion compensation coefficient having a reverse characteristic, of the non-linear distortion of the amplifier by a transmission baseband signal before being input to the amplifier in advance, thereby increasing linearity of an output of the amplifier to inhibit the distortion of the output of the amplifier. The signal obtained by multiplying the transmission baseband signal by the distortion compensation coefficient is sometimes also referred to as a "pre-distortion signal (PD signal)". Therefore, the PD signal is the signal distorted in advance according to the reverse characteristic of the non-linear distortion of the amplifier before being input, to the amplifier.

For example, there is the PD distortion compensation device including a look-up table (hereinafter, sometimes also referred to as "LUT") in which a plurality of distortion compensation coefficients is stored, the device which indicates an address according to the power of the transmission baseband signal to the LUT to read the distortion compensation coefficient from the LUT. The distortion compensation coefficient stored in the LUT is sequentially updated such that an error between the transmission baseband signal as a reference signal and a signal output from the amplifier to be fed back (hereinafter, sometimes also referred to as a "feedback signal") is minimum.

Related-art examples are described, for example, in Japanese Laid-open Patent Publication No. 2011-199428.

In the PD distortion compensation device using the LUT, processes in which there is the access to the LUT roughly include following three processes. That is to say, a first process is the process in which the LUT is referred to and the distortion compensation coefficient to be multiplied by the transmission baseband signal is read from the LUT (hereinafter, sometimes also referred to as "reference time reading"). A second process is the process in which the distortion compensation coefficient, the distortion compensation coefficient being an updating target, is read from the LUT for updating the distortion compensation coefficient of the LUT (hereinafter, sometimes also referred to as "update time reading"). A third process is the process in which an adjusted distortion compensation coefficient is written in the LUT (hereinafter, sometimes also referred to as "update time writing").

Herein, the LUT of the distortion compensation device is often realized by using a dual port memory such as a dual port RAM (random access memory). The access to the LUT is performed by the above-described first to third three processes while the number of ports of the dual port memory is two. Therefore, it is important to efficiently access the LUT by appropriately dividing the access to the LUT occurring in the three processes into the two ports.

Herein, the distortion compensation coefficient is multiplied by all the transmission baseband signals, so that the reference time reading is performed in real time. That is to say, it is not preferable to intermittently perform the reference time reading. On the other hand, it is sufficient to update the distortion compensation coefficient such that desired distortion compensation accuracy can be maintained, so that the update time reading and the update time writing are not necessary performed in real time. That is to say, it is allowed that the update time reading and the update time writing are intermittently performed.

Figure 1:
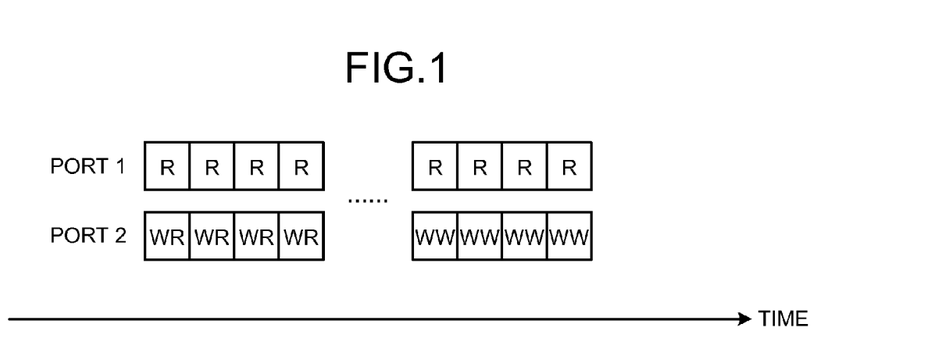
FIG. 1 is a view for illustrating a problem.

Therefore, the technology illustrated in FIG. 1 is suggested. FIG. 1 is a view for illustrating a problem. In FIG. 1, "R" represents the reference time reading, "WR" represents the update time reading, and "WW" represents the update time writing. The same applies to the following drawings. That is to say, out of two ports of the LUT being a port 1 and a port 2, the reference time reading is always performed by using the port 1. In contrast, the update time reading and the update time writing are performed by using the port 2 of the LUT. That is to say, a plurality of times of update time reading is collectively performed from the port 2, a plurality of distortion compensation coefficients read from the LUT is temporarily stored in a memory, a plurality of distortion compensation coefficients stored in the memory is adjusted, and a plurality of adjusted distortion compensation coefficients is collectively written in the LUT. For example, when the distortion compensation coefficients for 1000 samples of transmission baseband signals are updated, in the port 2, the update time reading of the 1000 samples is collectively performed, and thereafter, the update time writing of 1000 samples is collectively performed. In this manner, by collectively and sequentially performing a plurality of times of update time reading and collectively and sequentially performing a plurality of times of update time writing in a time-division manner, it becomes possible to avoid competition between the update time reading and the update time writing in one port and perform the update time reading and the update time writing by using one port.

However, in the technology to collectively and sequentially perform a plurality of times of update time reading and collectively and sequentially perform a plurality of times of update time writing in a time-division manner, the memory which stores a plurality of distortion compensation coefficients read from the LUT is provided in the distortion compensation device, so that a circuit scale of the distortion compensation device becomes large. When the circuit scale of the distortion compensation device becomes large, a circuit scale of the wireless transmission device provided with the distortion compensation device also becomes large.

SUMMARY

According to an aspect of an embodiment, a wireless transmission device includes an amplifier that amplifies power of a wireless transmission signal, a table that stores a plurality of distortion compensation coefficients used for compensating non-linear distortion of the amplifier, and a control unit that alternately performs reading of one distortion compensation coefficient and writing of one distortion compensation coefficient adjusted based on a feedback signal from the amplifier, by using any one port of the table at the time of update of any distortion compensation coefficient out of the plurality of distortion compensation coefficients stored in the table.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be explained with reference to accompanying drawings. Meanwhile, the wireless transmission device disclosed in the present application is not limited by the embodiments. The same reference sign is assigned to components having the same function and steps of performing the same process in the embodiments and the description thereof is not repeated.

[a] First Embodiment

Configuration of Wireless Transmission Device

Figure 2:
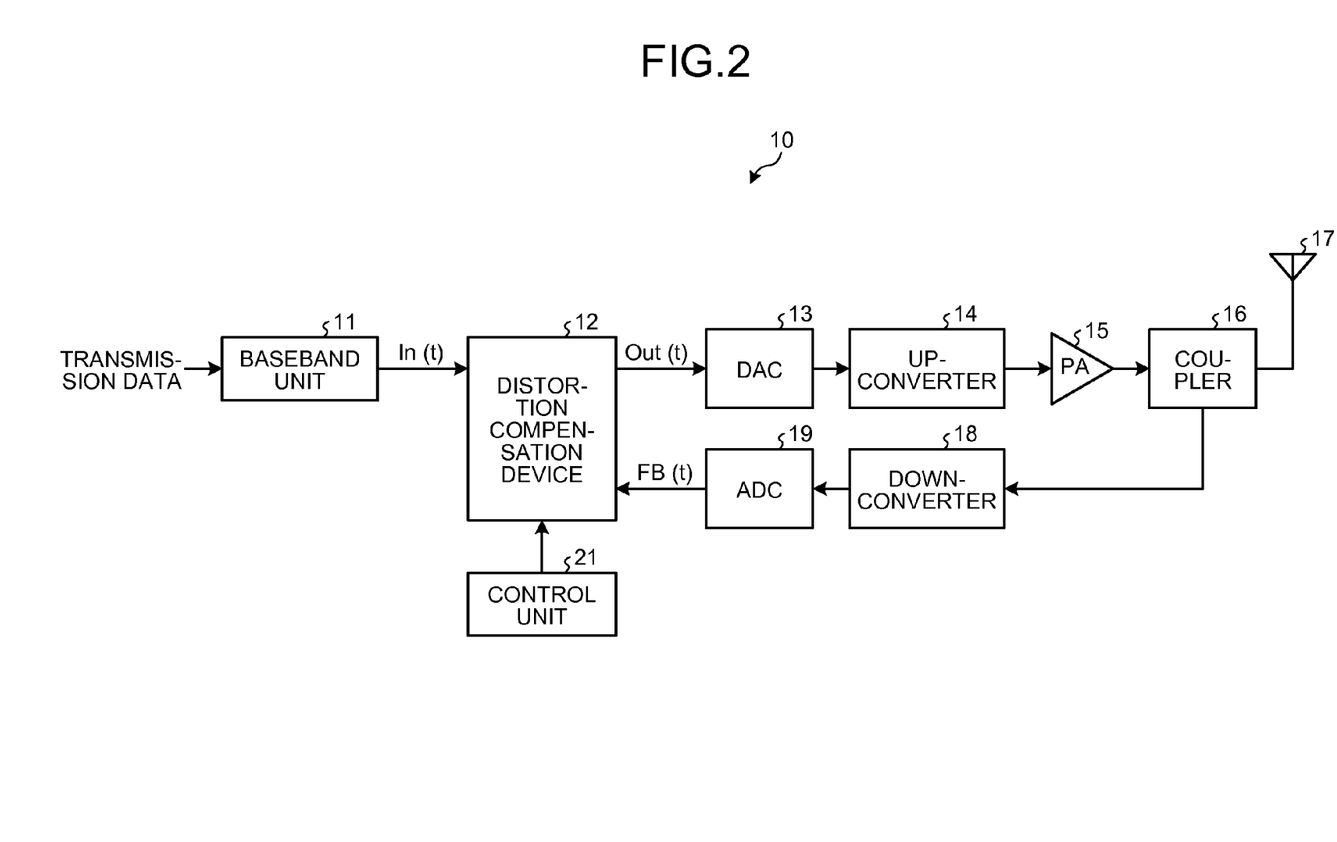
FIG. 2 is a block diagram illustrating a configuration example of a wireless transmission device of a first embodiment.

FIG. 2 is a block diagram illustrating a configuration example of a wireless transmission device of a first embodiment. In FIG. 2, a wireless transmission device 10 includes a baseband unit 11, a distortion compensation device 12, a DAC (digital to analog converter) 13, an up-converter 14, a PA (power amplifier) 15, and a coupler 16. The wireless transmission device 10 also includes an antenna 17, a down-converter 18, an ADC (analog to digital converter) 19, and a control unit 21.

The wireless transmission device 10 is mounted on a wireless communication terminal device, a wireless communication base station device or the like used in a wireless communication system, for example.

The baseband unit 11 performs baseband processing such as encoding processing and modulation processing on transmission data input thereto to generate a transmission baseband signal and outputs a generated transmission baseband signal In(t) to the distortion compensation device 12.

The distortion compensation device 12 being a PD distortion compensation device includes an LUT in which distortion compensation coefficients are stored in respective addresses corresponding to a plurality of power ranges. The distortion compensation device 12 refers to the LUT according to the address generated according to power of the transmission baseband signal and multiplies the distortion compensation coefficient read from the LUT by the transmission baseband signal to generate a PD signal Out(t), then outputs the generated PD signal Out(t) to the DAC 13. The distortion compensation device 12 also updates the distortion compensation coefficient stored in the LUT based on an error between the transmission baseband signal In(t) as a reference signal and a feedback signal FB(t).

The DAC 13 converts the PD signal being a digital signal to an analog signal and outputs the same to the up-converter 14.

The up-converter 14 up-converts the analog PD signal and outputs the up-converted PD signal to the PA 15.

The PA 15 amplifies power of the up-converted PD signal and outputs a power-amplified signal to the coupler 16.

The coupler 16 distributes the power-amplified signal to the antenna 17 and the down-converter 18. According to this, the signal output from the PA 15 is fed back to the distortion compensation device 12 through the down-converter 18 and the ADC 19.

The antenna 17 wirelessly transmits the power-amplified signal.

The down-converter 18 down-converts the signal input from the coupler 16 and outputs the down-converted signal to the ADC 19.

The ADC 19 converts the down-converted signal being an analog signal to a digital signal and outputs the converted digital signal to the distortion compensation device 12 as the feedback signal FB(t).

The control unit 21 controls the distortion compensation device 12. Especially, the control unit 21 controls access to the LUT included in the distortion compensation device 12. The control performed by the control unit 21 is described later in detail.

Configuration of Distortion Compensation Device

Figure 3:
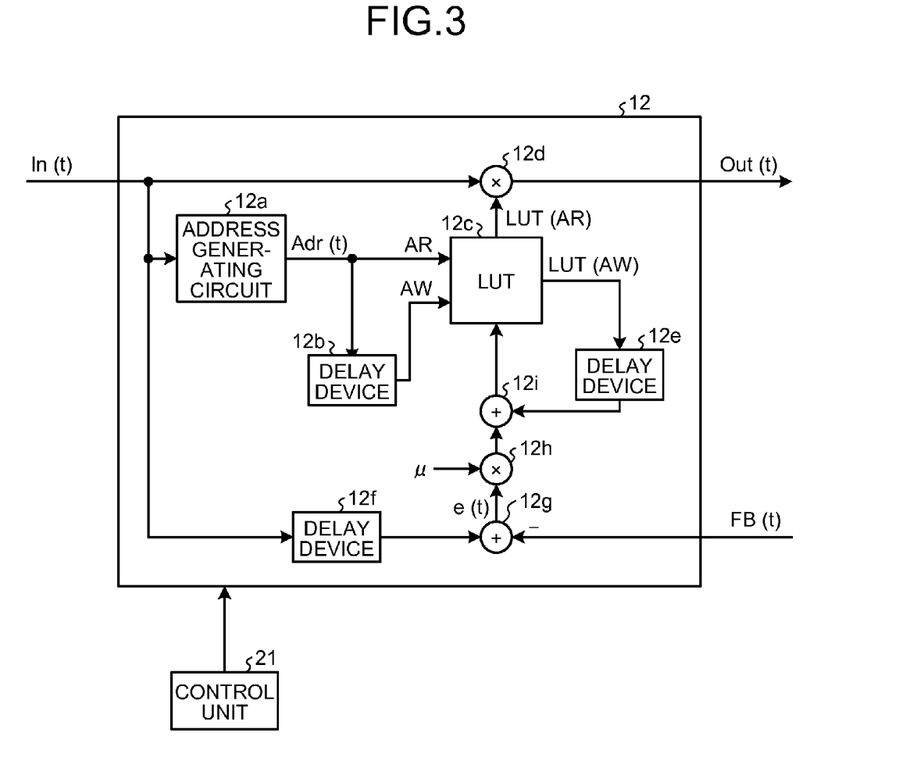
FIG. 3 is a block diagram illustrating a configuration example of a distortion compensation device of the first embodiment.

FIG. 3 is a block diagram illustrating a configuration example of the distortion compensation device of the first embodiment. In FIG. 3, the distortion compensation device 12 includes an address generating circuit 12a, delay devices 12b, 12e, and 12f, an LUT 12c, multipliers 12d and 12h, a subtracter 12g, and an adder 12i.

Each of the delay devices 12b, 12e, and 12f is realized by a flip-flop circuit, for example.

The transmission baseband signal In(t) is input to the address generating circuit 12a and the multiplier 12d. The transmission baseband signal In(t) is input to the delay device 12f as the reference signal.

The address generating circuit 12a generates an address Adr(t) according to a power value of the transmission baseband signal In(t) and outputs the generated address Adr(t) to the LUT 12c as a read address AR. The address generating circuit 12a also outputs the generated address Adr(t) to the delay device 12b.

The delay device 12b delays the address Adr(t) by a delay amount d1 and outputs the delayed address Adr(t) to the LUT 12c as a write address AW. The delay amount d1 corresponds to a total processing delay amount in the multiplier 12d, the DAC 3, the up-converter 14, the PA 15, the coupler 16, the down-converter 18, the ADC 19, the subtracter 12g, the multiplier 12h, and the adder 12i.

The LUT 12c realized by using a dual port memory such as a dual port RAM (random access memory), for example, includes two ports.

The LUT 12c stores a plurality of distortion compensation coefficients corresponding to a plurality of addresses in a one-to-one manner and outputs a distortion compensation coefficient LUT(AR) corresponding to the input read address AR to the multiplier 12d. The LUT 12c outputs the distortion compensation coefficient LUT (AR) to the multiplier 12d by using one of the two ports, for example, a port 1.

The LUT 12c outputs a distortion compensation coefficient LUT(AW) corresponding to the input read address AR to the delay device 12e. The LUT 12c writes the distortion compensation coefficient input from the adder 12i in the write address AW input from the delay device 12b. The LUT 12c outputs the distortion compensation coefficient LUT (AW) and writes the distortion compensation coefficient by using the other of the two ports, for example, a port 2.

The multiplier 12d multiplies the transmission baseband signal In(t) by the distortion compensation coefficient LUT (AR) to generate the PD signal Out(t) and outputs the generated PD signal Out(t) to the DAC 13.

The delay device 12f delays the transmission baseband signal In(t) as the reference signal by a delay amount d2 and outputs the delayed reference signal to the subtracter 12g. The delay amount d2 corresponds to a total processing delay amount in the multiplier 12d, the DAC 13, the up-converter 14, the PA 15, the coupler 16, the down-converter 18, and the ADC 19.

The subtracter 12g calculates an error signal e(t) between the reference signal input from the delay device 12f and the feedback signal FB(t) and outputs the calculated error signal e(t) to the multiplier 12h.

The multiplier 12h multiplies a step size parameter μ by the error signal e(t) and outputs a multiplied signal "μ×e(t)" to the adder 12i.

The delay device 12e delays the distortion compensation coefficient LUT (AW) by a delay amount d3 and outputs the delayed distortion compensation coefficient LUT(AW) to the adder 12i. The delay amount d3 corresponds to a total processing delay amount in the multiplier 12d, the DAC 13, the up-converter 14, the PA 15, the coupler 16, the down-converter 18, the ADC 19, the subtracter 12g, and the multiplier 12h.

The adder 12i adjusts the distortion compensation coefficient LUT(AW) input from the delay device 12e. That is to say, the adder 12i adds the multiplied signal μ×e(t) to the distortion compensation coefficient LUT(AW) before adjustment and outputs an addition result "LUT(AW)+μ×e(t)" to the LUT 12c as the adjusted distortion compensation coefficient.

The control unit 21 controls reference time read timing, update time read timing, and update time write timing in the LUT 12c. That is to say, the control unit 21 controls read timing of the address Adr(t) from the address generating circuit 12a, thereby controlling the "reference time read timing" at which the distortion compensation coefficient LUT(AR) is read from the LUT 12c to be output to the multiplier 12d. The control unit 21 controls read timing of the write address AW from the delay device 12b, thereby controlling the "update time read timing" at which the distortion compensation coefficient LUT(AW) is read from the LUT 12c to be output to the delay device 12e. The control unit 21 controls read timing of the reference signal from the delay device 12f and read timing of the distortion compensation coefficient LUT(AW) from the delay device 12e, thereby controlling the "update time write timing" at which the adjusted distortion compensation coefficient being the addition result by the adder 12i is written in the LUT 12c. An example of the above-described timing control is hereinafter described.

Operation of Distortion Compensation Device

Figure 4:
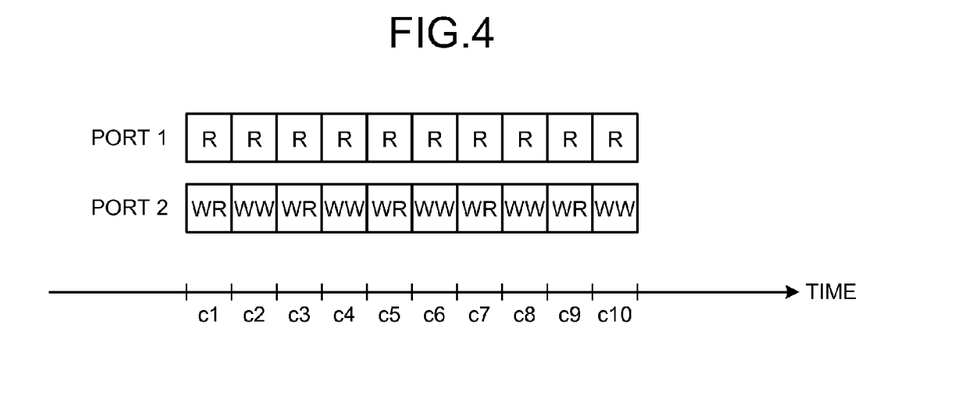
FIG. 4 is a view for illustrating an operation example of the distortion compensation device of the first embodiment.

FIG. 4 is a view for illustrating an operation example of the distortion compensation device of the first embodiment. The distortion compensation device 12 operates in a manner in which access timing to the LUT 12c is controlled by the control unit 21 in a following manner, fox example.

As illustrated in FIG. 4, the control unit 21 reads the address Adr(t) from the address generating circuit 12a in each of cycles c1 to c10, for example. That is to say, the control unit 21 sequentially reads addresses Adr(t1) to Adr(t10) from the address generating circuit 12a. According to this, the read address AR is input to the LUT 12c and the distortion compensation coefficient: LUT (AR) is output from the port 1 out of the two ports of the port 1 and the port 2 of the LUT 12c in each of the cycles c1 to c10. That is to say, the control unit 21 performs reference time reading in each of the cycles c1 to c10 by using the port 1. Therefore, each of the cycles c1 to c10 becomes the reference time read timing.

In contrast, the control unit 21 alternately performs update time reading of one distortion compensation coefficient and update time writing of one distortion compensation coefficient by using the port 2 out of the two ports of the port 1 and the port 2 of the LUT 12c.

That is to say, the control unit 21 performs nth update time reading of one distortion compensation coefficient in the cycle c1, performs nth update time writing of one distortion compensation coefficient in the cycle c2, performs n+1st update time reading of one distortion compensation coefficient in the cycle c3, and performs n+1st update time writing of one distortion compensation coefficient, in the cycle c4 by using the port 2. The same applies to the cycles c5 to c10. Note that n is a natural number, Therefore, each of the cycles c1, c3, c5, c7, and c9 out of the cycles c1 to c10 is the update time read timing. Also, each of the cycles c2, c4, c6, c8, and c10 out of the cycles c1 to c10 is the update time write timing.

In order to alternately perform the update time reading of one distortion compensation coefficient and the update time writing of one distortion compensation coefficient by using one port being the port 2, the control unit 21 reads the distortion compensation coefficients LUT(AW) corresponding to the read addresses AR of the addresses Adr(t1) to Adr(t5) from the LUT 12c in the cycles c1, c3, c5, c7, and c9. The control unit 21 reads the write addresses AW of the addresses Adr(t1) to Adr(t5) from the delay device 12b, reads the distortion compensation coefficients LUT(AW)

corresponding to the write addresses AW from the delay device 12e, and reads the transmission baseband signals In(t1) to In(t5) as the reference signals from the delay device 12f in the cycles c2, c4, c6, c8, and c10. According to this, the write addresses AW are input to the LUT 12c and the distortion compensation coefficients LUT(AW) are output from the LUT 12c in the cycles c2, c4, c6, c8, and c10. In the cycles c2, c4, c6, c8, and c10, the adjusted distortion compensation coefficients "LUT(AW)+µ×e(t)" are input to the LUT 12c and the adjusted distortion compensation coefficients are written in the write addresses AW.

Process of Distortion Compensation Device

Figure 5:
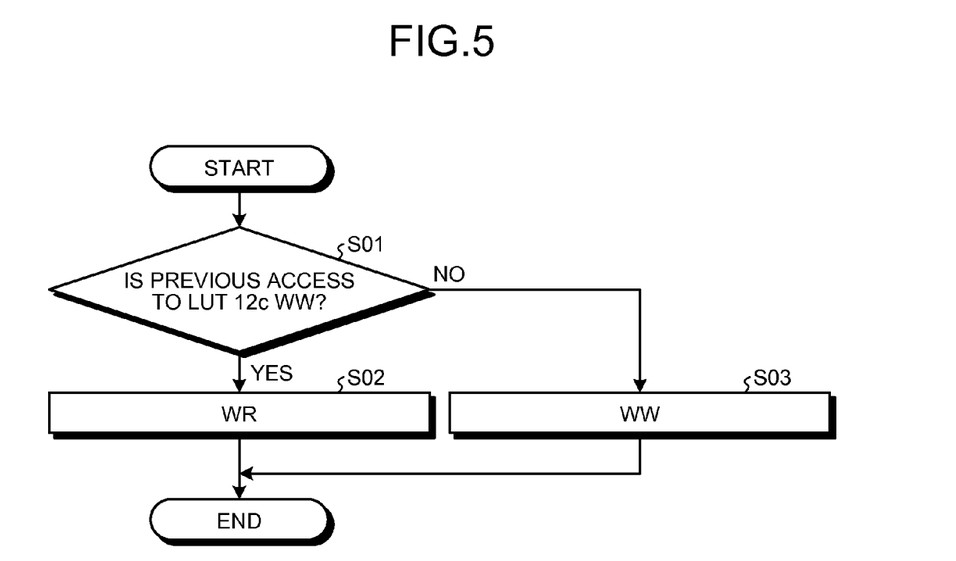
FIG. 5 is a flowchart for illustrating an example of a process of the distortion compensation device of the first embodiment.

FIG. 5 is a flowchart for illustrating an example of a process of the distortion compensation device of the first embodiment. The flowchart illustrated in FIG. 5 is repeatedly performed in each cycle. The flowchart illustrated in FIG. 5 illustrates the process in one of the two ports of the LUT 120 (for example, the port 2). In one port, any one of the update time reading and the update time writing is performed in each cycle. Meanwhile, in the other of the two ports of the LUT 12c (for example, the port 1), the reference time reading is performed in each cycle.

At step S01, the control unit 21 determines whether previous access to the LUT 12c is the update time writing.

When the previous access to the LUT 12c is the update time writing (Yes at step S01), the control unit 21 performs the update time reading in current access to the LUT 12c (step S02).

On the other hand, when the previous access to the LUT 12c is not the update time writing (No at step S01), that is to say, when the previous access to the LUT 12c is the update time reading, the control unit 21 performs the update time writing in the current access to the LUT 12c (step S03).

In the above-described manner, in the first embodiment, the wireless transmission device 10 includes the PA 15, the LUT 12c, and the control unit 21. The PA 15 amplifies the power of the wireless transmission signal. The LUT 12c stores a plurality of distortion compensation coefficients used for compensating for non-linear distortion of the PA 15. The control unit 21 alternately performs the update time reading of one distortion compensation coefficient and the update time writing of one distortion compensation coefficient adjusted based on the feedback signal from/to the LUT 12c by using any one port of the LUT 12c at the time of update of any distortion compensation coefficient out of the plurality of distortion compensation coefficients stored in the LUT 12c.

In this manner, by alternately performing the update time reading of one distortion compensation coefficient and the update time writing of one distortion compensation coefficient by using one port, a memory which stores a plurality of distortion compensation coefficients being updating targets becomes unnecessary. It is possible to avoid competition between the update time reading and the update time writing in one port without using the memory. Therefore, the first embodiment can make a circuit scale of the wireless transmission device small.

[b] Second Embodiment

In the first embodiment, the update time reading of one distortion compensation coefficient and the update time writing of one distortion compensation coefficient are alternately performed by using any one of the two ports of the LUT 12c for example, the port 2) as illustrated in FIG. 4.

However, when the update time reading of one distortion compensation coefficient and the update time writing of one distortion compensation coefficient are alternately performed as illustrated in FIG. 4, the update time read timing has half periodicity, so that a band of the feedback signal decreases by half. When the band of the feedback signal decreases by half, a bandwidth which can be measured as the band of distortion compensation decreases by half, so that a distortion compensation characteristic is deteriorated.

Therefore, in a second embodiment, the update time reading is performed at random timing in a following manner.

Configuration of Wireless Transmission Device

Figure 6:
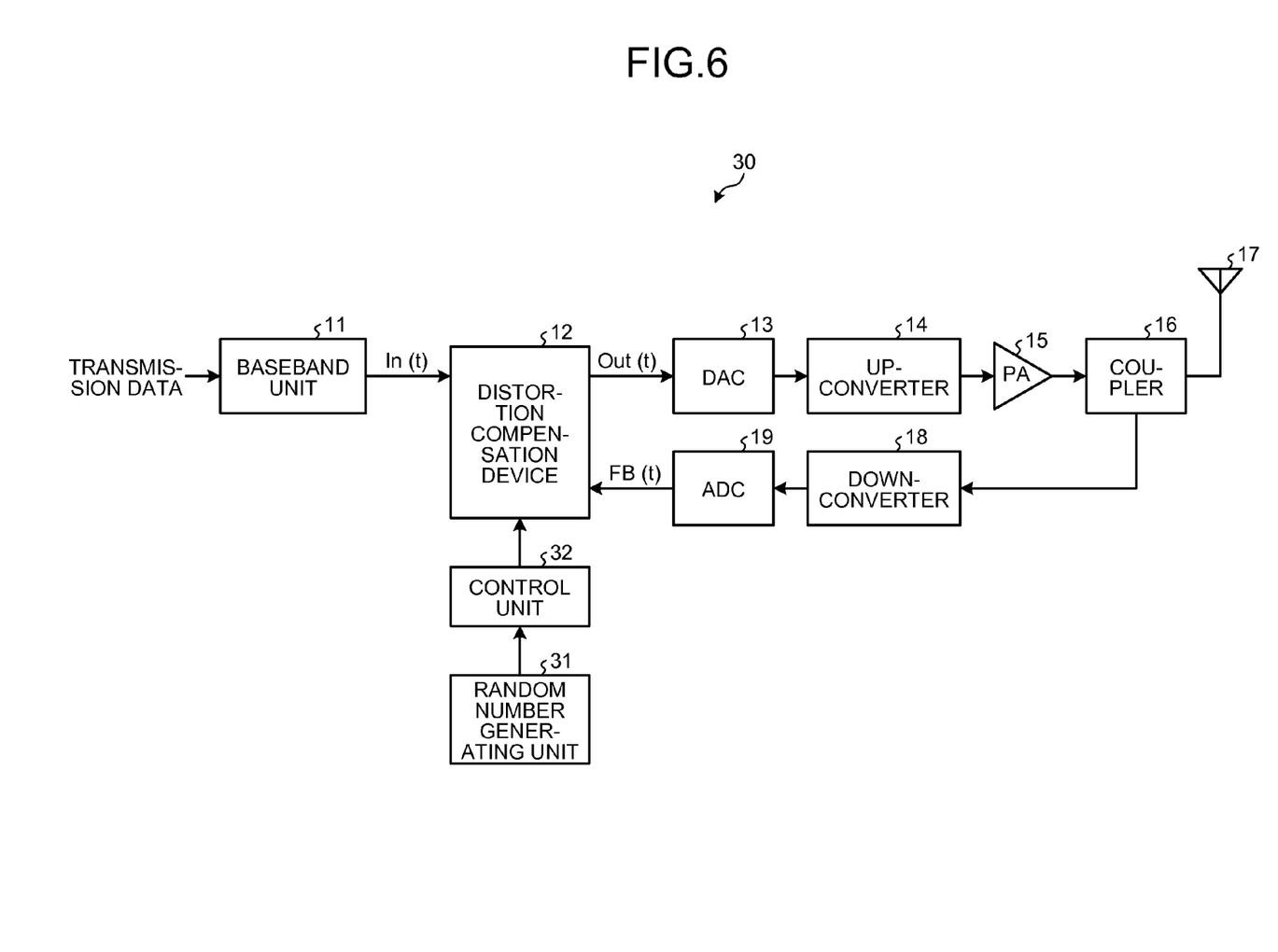
FIG. 6 is a block diagram illustrating a configuration example of a wireless transmission device of a second embodiment.

FIG. 6 is a block diagram illustrating a configuration example of a wireless transmission device of the second embodiment. In FIG. 6, a wireless transmission device 30 includes a baseband unit 11, a distortion compensation device 12, a DAC 13, an up-converter 14, a PA 15, and a coupler 16. The wireless transmission device 30 also includes an antenna 17, a down-converter 18, an ADC 19, a random number generating unit 31, and a control unit 32.

The random number generating unit 31 generates a random number and outputs the generated random number to the control unit 32 in each cycle.

The control unit 32 controls the distortion compensation device 12 based on the random number input from the random number generating unit 31. Especially, the control unit 32 controls access to an LUT 12c of the distortion compensation device 12 based on the random number input from the random number generating unit 31. The control performed by the control unit 32 is described later in detail.

Configuration of Distortion Compensation Device

Figure 7:
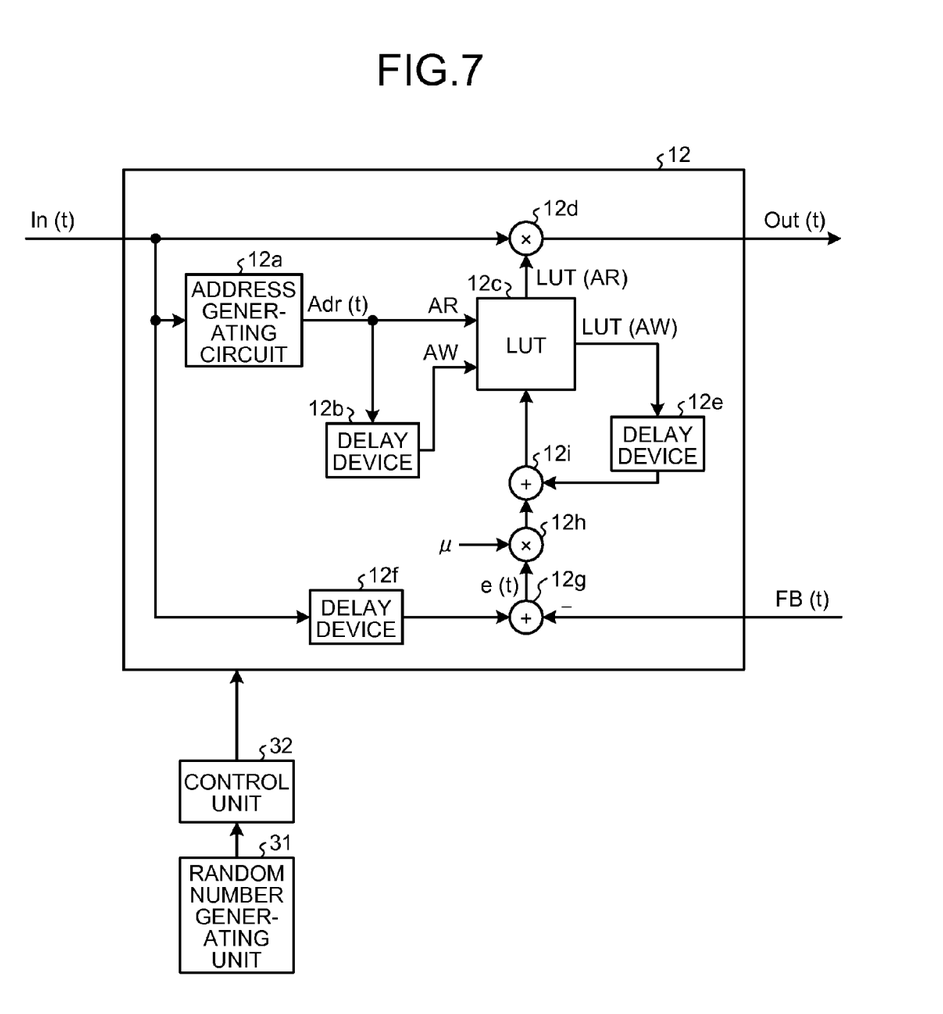
FIG. 7 is a block diagram illustrating a configuration example of a distortion compensation device of the second embodiment.

FIG. 7 is a block diagram illustrating a configuration example of the distortion compensation device of the second embodiment. In FIG. 7, the distortion compensation device 12 includes an address generating circuit 12a, delay devices 12b, 12e, and 12f, the LUT 12c, multipliers 12d and 12h, a subtracter 12g, and an adder 12i. That is to say, the distortion compensation device of the second embodiment has the configuration similar to that of the distortion compensation device of the first embodiment.

Operation of Distortion Compensation Device

Figure 8:
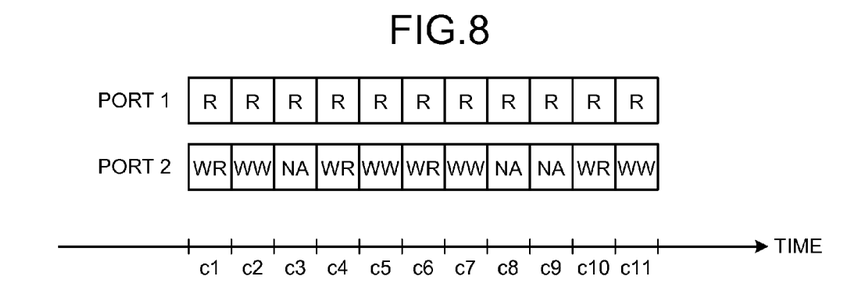
FIG. 8 is a view for illustrating an operation example of the distortion compensation device of the second embodiment.

FIG. 8 is a view for illustrating an operation example of the distortion compensation device of the second embodiment. The distortion compensation device 12 operates in a manner in which access timing to the LUT 12c is controlled by the control unit 32 in a following manner, for example.

The control unit 32 is similar to the control unit 21 of the first embodiment in that this performs reference time reading by using a port 1 in each of cycles c1 to c10. The control unit 32, as the control unit 21 of the first embodiment, alternately performs update time reading of one distortion compensation coefficient and update time writing of one distortion compensation coefficient by using a port 2.

In contrast, in the second embodiment, the control unit 32 performs the update time reading by using the port 2 only at timing at which the random number input from the random number generating unit 31 satisfies a predetermined condition. For example, when the random number generating unit 31 randomly generates any numerical value "0" or "1" in each cycle, the control unit performs the update time reading when the numerical value input from the random number generating unit 31 is "1". For example, when the random number generating unit 31 randomly generates the numerical value in a range from 0 to 1 in each cycle, the control unit 32 performs the update time reading when the numerical value input from the random number generating unit 31 is not smaller than 0.5. In this manner, when the random number generated by the random number generating unit 31 satisfies a predetermined condition, the control unit 32 performs the update time reading. According to this, the control unit 32 can perform the update time reading at random timing. Therefore, it becomes possible to prevent the update time read timing from having half periodicity.

Typically, the control unit 32 performs nth update time reading of one distortion compensation coefficient in the cycle c1 in which the random number satisfies a predetermined condition and performs nth update time writing of one distortion compensation coefficient in the cycle c2 following the cycle c1 by using the port 2. The control unit 21 performs n+1st update time reading of one distortion compensation coefficient in the cycle c4 in which the random number satisfies a predetermined condition and performs n+1st update time writing of one distortion compensation coefficient in the cycle c5 following the cycle c4 by using the port 2. The same applies to the cycles c6 and c7 and the cycles c10 and c11. That is to say, the control unit 32 typically performs the update time reading in the cycle in which the random number satisfies a predetermined condition and performs the update time writing in the cycle following the cycle in which the update time reading is performed by using the port 2. The control unit 32 does not access the LUT 12c in the cycle in which neither the update time reading nor the update time writing is performed by using the port 2. In FIG. 8, a representation "NA (no action)" in the port 2 indicates that neither the update time reading no the update time writing is performed and there is no access to the LUT 12c.

Meanwhile, the operation example in which there is no NA between WR and WW in the port 2 is illustrated in FIG. 8, the control unit 32 may interpose NA between WR and WW.

Process of Distortion Compensation Device

Figure 9:
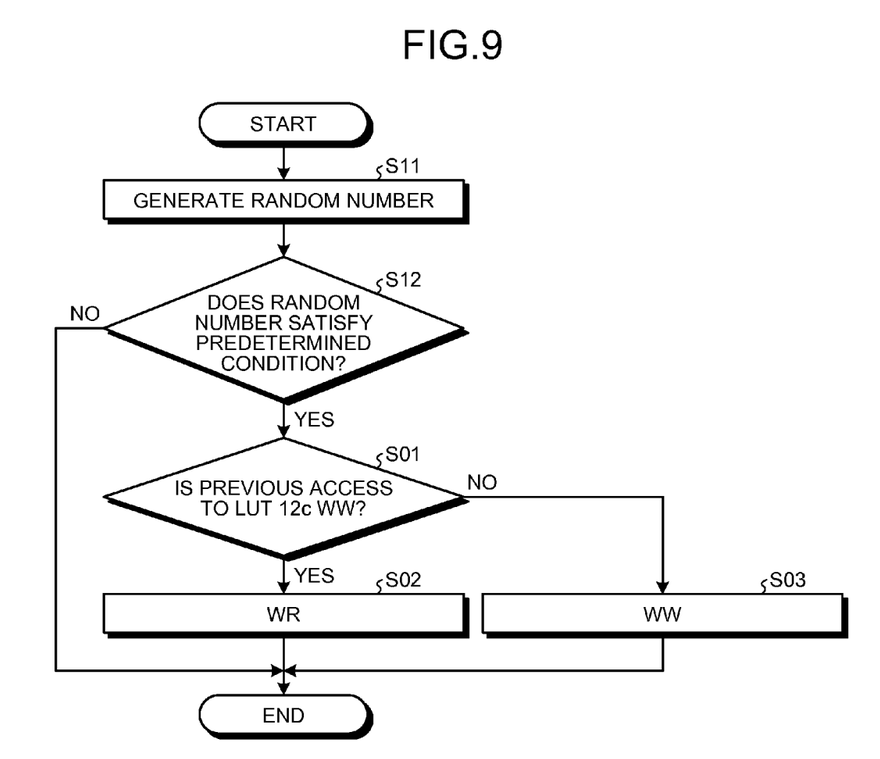
FIG. 9 is a flowchart for illustrating an example of a process of the distortion compensation device of the second embodiment.

FIG. 9 is a flowchart for illustrating an example of a process of the distortion compensation device of the second embodiment. The flowchart illustrated in FIG. 9 is repeatedly performed in each cycle. The flowchart illustrated in FIG. 9 illustrates the process in one of the two ports of the LUT 12c (for example, the port 2). In one port, any one of the update time reading and the update time writing is performed in each cycle. Meanwhile, the reference time reading is performed in each cycle in the other of the two ports of the LUT 12c (for example, the port 1).

At step S11, the random number generating unit 31 generates the random number and outputs the generated random number to the control unit 32.

Next, the control unit 32 determines whether the random number satisfies a predetermined condition (step S12). When the random number does not satisfy a predetermined condition (No at step S12), the process is finished.

On the other hand, when the random number satisfies a predetermined condition (Yes at step S12), the process shifts to step S01. The process after step S01 is similar to that of the first embodiment (FIG. 5), so that the description thereof is omitted.

As described above, according to the second embodiment, as the first embodiment, the control unit 32 alternately performs the update time reading of one distortion compensation coefficient and the update time writing of one distortion compensation coefficient adjusted based on the feedback signal from/to the LUT 12c by using any one port of the LUT 12c. Furthermore, in the second embodiment, the control unit 32 performs the update time reading at random timing.

In this manner, it becomes possible to prevent the update time read timing from having periodicity in addition to the effect obtained by the first embodiment. Therefore, according to the second embodiment, it is possible to make a circuit scale of the wireless transmission device small and prevent deterioration in a distortion compensation characteristic by the periodicity of the update time read timing.

The first and second embodiments are described as above.

[c] Another Embodiment

A distortion compensation device 12 is realized by a FPGA (field programmable gate array) and the like, for example, as hardware. Each of control units 21 and 32 and a random number generating unit 31 is realized by an MPU (micro processing unit) and the like, for example, as the hardware.

According to the aspect of the disclosure, the circuit, scale of the wireless transmission device can be made small.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A wireless transmission device comprising:
an amplifier that amplifies power of a wireless transmission signal;
a table that stores a plurality of distortion compensation coefficients used for compensating non-linear distortion of the amplifier; and
a control unit that determines whether previous access to any one port of the table is writing of one distortion compensation coefficient adjusted based on a feedback signal from the amplifier, performs reading of one distortion compensation coefficient from the table in current access to the any one port when the previous access is the writing, and performs the writing in the current access to the any one port when the previous access is not the writing; and
a random number generating unit that generates a random number, wherein the control unit performs the reading when the generated random number satisfies a predetermined condition.

* * * * *